United States Patent [19]
Cheng et al.

[11] Patent Number: 5,811,220
[45] Date of Patent: Sep. 22, 1998

[54] ON-PRESS LITHOGRAPHIC DEVELOPMENT METHODOLOGY FACILITATED BY THE USE OF A DISPERSE HYDROPHILIC MICROGEL

[75] Inventors: Chieh-Min Cheng, Rochester, N.Y.; Rong-Chang Liang, Newton; Yi-Hua Tsao, Waltham, both of Mass.

[73] Assignee: Polaroid Corporation, Cambridge, Mass.

[21] Appl. No.: 729,291

[22] Filed: Oct. 10, 1996

[51] Int. Cl.[6] .................................................. G03F 7/30
[52] U.S. Cl. ........................... 430/302; 101/456; 101/457
[58] Field of Search ..................... 430/302, 138; 101/456, 457

[56] References Cited

U.S. PATENT DOCUMENTS

| | | | |
|---|---|---|---|
| 3,895,082 | 7/1975 | Hochberg | 260/885 |
| 4,186,069 | 1/1980 | Muzyczko et al. | 430/302 X |
| 4,414,278 | 11/1983 | Cohen et al. | 428/402 |
| 4,726,877 | 2/1988 | Fryd et al. | 156/630 |
| 4,753,865 | 6/1988 | Fryd et al. | 430/281.1 |
| 4,937,173 | 6/1990 | Kanda et al. | 430/281.1 |
| 4,956,252 | 9/1990 | Fryd et al. | 430/138 |
| 5,120,796 | 6/1992 | Fukuchi | 525/286 |
| 5,171,655 | 12/1992 | Aoshima | 430/138 |
| 5,229,434 | 7/1993 | Fukuchi | 522/110 |
| 5,348,844 | 9/1994 | Garmong | 430/286.1 |
| 5,362,604 | 11/1994 | Yatsuyanagi | 430/281.1 |
| 5,393,637 | 2/1995 | Kanda et al. | 430/138 |
| 5,407,764 | 4/1995 | Cheema et al. | 430/302 X |
| 5,506,090 | 4/1996 | Gardner, Jr. et al. | 430/302 |
| 5,599,650 | 2/1997 | Bi et al. | 430/281.1 X |
| 5,607,816 | 3/1997 | Fitzgerald et al. | 430/302 X |
| 5,677,108 | 10/1997 | Chia et al. | 430/138 X |

FOREIGN PATENT DOCUMENTS

| | | |
|---|---|---|
| 967051 | 8/1964 | United Kingdom . |
| WO96/34316 | 10/1996 | WIPO . |

*Primary Examiner*—Cynthia Hamilton
*Attorney, Agent, or Firm*—Renato M. de Luna

[57] ABSTRACT

The present invention provides a method for developing a lithographic plate on a printing press without the requirement of bath processing, the printing press equipped with means for delivering ink and aqueous fountain solutions to the plate, the preferred plate having in order (a) a substrate; and (b) a photoresist photohardenable upon imagewise exposure to actinic radiation, the photoresist comprising (i) a macromolecular organic binder; (ii) a photopolymerizable ethylenically unsaturated monomer having at least one terminal ethylenic group capable of forming a high polymer by chain-propagated polymerization, (iii) a polymerization initiator activatable by actinic radiation, and (iv) a disperse hydrophilic microgel. According to a product aspect, the present invention also provides a lithographic plate, configured as indicated, with the further combination therewith of an on-press removable polymeric overcoat.

11 Claims, 3 Drawing Sheets

ON-PRESS LITHOGRAPHIC DEVELOPMENT METHODOLOGY FACILITATED BY THE USE OF A DISPERSE HYDROPHILIC MICROGEL

FIELD OF THE INVENTION

The present invention relates generally to a lithographic printing methodology that does not require "bath-processing" subsequent to exposure and prior to printing on a press. More particularly, the present invention relates to the on-press development of a lithographic plate, the lithographic plate provided with a hydrophobic photosensitive layer incorporating therein a disperse hydrophilic microgel.

BACKGROUND

At the present time, virtually all printed copy is produced through the use of three basic types of printing plates. One type is a relief plate which prints from a raised surface. Another type is an intaglio plate which prints from a depressed surface. The third type is a lithographic plate which prints from a substantially flat surface which is neither appreciably raised above nor appreciably depressed below the adjacent and surrounding non-printing areas. The present invention concerns the third type of printing plate.

Lithographic printing is occasioned by an ink's respective affinity and/or aversion to areas of different chemical properties. Lithographic printing plates are commonly processed to have water-repellent (hydrophobic), oil-receptive (oleophilic) image areas and water-receptive (hydrophilic) non-image areas.

In preparing a conventional lithographic plate for use on a printing press, the plate is first imagewise exposed to actinic radiation. Specific chemical reactions are caused to occur in the plate's photoresist by exposure to actinic radiation. Such photoinduced chemical reactions may either reduce or enhance the solubility of the photoresist, depending on whether the resist is negative-working or positive-working. In negative-working plates, exposure to actinic radiation will generally cause a "hardening" of the photoresist. In positive-working plates, exposure to actinic radiation will generally cause a "softening" or solubilization of the photoresist.

After photoexposure, a wet development step is normally conducted to remove those areas of the photoresist which have undergone photoinduced chemical change or those which have not been photoexposed. Solvation under conventional development techniques will typically involve treating the exposed plate with organic solvents in a developing bath. For negative-working resists, the solvent will swell and dissolve the unexposed portions of the resist. For positive-working resists, the response of the unexposed and exposed coatings are reversed, but the same general principles apply. In either case, the solvent should not react with the unintended portions, otherwise distortion of the developed image may result.

As a result of the preferential solvation and washing away of portions of the photoresist, corresponding portions of the underlying hydrophilic substrate are uncovered. For negative-working plates, the aforementioned hydrophobic image areas correspond to the portions of the photoresist remaining after solvation and washing, whereas the aforementioned hydrophilic non-image areas correspond to portions of the substrate revealed by said solvation and washing. The image and non-image areas thus differentiated, the processed plate may then be mounted onto a printing press and run.

Encumbered by required wet development, the processing of conventional lithographic plates prior to their use on a printing press is both time and labor consuming and involves use of volatile organic chemicals. Considerable desire is thus present for means that would satisfactorily eliminate or reduce the long-felt dependency of conventional lithographic processes upon the conduct of wet development and thereby permit use of lithographic plates on a printing press immediately after exposure without required post-exposure prepress processing.

So-called "expose-only", "no-process", and "on-press developable" lithographic plates have been suggested. Among printing plates that may be characterized as such are: e.g., U.S. Pat. No. 3,793,033, issued to Mukherjee on Feb. 19, 1974; U.S. Pat. No. 4,273,851, issued to Muzyczko et al. on Jun. 16, 1981; U.S. Pat. No. 4,408,532, issued to J. H. Incremona on Oct. 11, 1983; U.S. Pat. No. 5,258,263, issued to Z. K. Cheema, A. C. Giudice, E. L. Langlais, and C. F. St. Jacques on Nov. 2, 1993; U.S. Pat. No. 5,368,973, issued to Hasegawa on Nov. 29, 1994; U.S. Pat. No. 5,395,734, issued to Vogel et al. on Mar. 7, 1995; U.S. Pat. No. 5,506,090, issued to Gardner et al. on Apr. 9, 1996; U.S. Pat. No. 5,514,522, issued to W. C. Schwarzel, F. R. Kearney, M. J. Fitzgerald, and R. C. Liang on May 7, 1996; and U.S. Pat. No. 5,516,620, issued to L. C. Wan, A. C Giudice, J. M. Hardin, C. M. Cheng, and R. C. Liang on May 14, 1996. Mention may also be made of PCT/US95/11104; U.S. Pat. No. 5,488,147; GB 9322705; EP 599463; EP 562952; U.S. Pat. Nos. 5,314,785; 5,225,316; 5,235,015; 5,102,771; and 5,085,972.

Despite the methodologies and approaches embodied in the aforementioned patents, there is a continuing need for improvements and/or alternative methodologies, whereby a lithographic plate precursor can be readily developed on a printing press, yet produce a printing plate having durable image areas needed for good run length.

SUMMARY OF THE INVENTION

It has been found that the incorporation of dispersed hydrophilic microgel in the photosensitive layer of a lithographic plate results in a printing article plate precursor that is durable and non-tacky, and which has enhanced on-press developability characteristics. Good contrast and resolution can also be accomplished without noticeable degradation of ink receptability.

In accomplishment of its objectives, the present invention provides a method for developing a lithographic plate on a lithographic printing press without the requirement of bath processing; the lithographic printing plate having in order (a) a printing plate substrate and (b) a photosensitive layer imagewise responsive to actinic radiation; and wherein the photosensitive layer comprises at least a photopolymerizable, photocrosslinkable, or photorearrangeable compound and a hydrophilic microgel dispersed therein. In the preferred embodiment, the photosensitive layer comprises a macromolecular organic binder, a photopolymerizable ethylenically unsaturated monomer having at least one terminal ethylenic group capable of forming a high polymer by chain propagated polymerization, and a polymerization initiator activatable by actinic radiation.

It is one object of the present invention to provide a method for lithographically printing images onto a receiving medium from an on-press developed lithographic printing plate, the plate and method being characterized by the use of a hydrophobic photoresist layer having therein incorporated a hydrophilic microgel dispersion.

It is another object of the present invention to provide a non-tacky on-press developable lithographic plate having good durability and good developability.

It is another object of the present invention to provide an on-press developable overcoated lithographic plate having a photosensitive layer, the photosensitive layer incorporating therein a disperse hydrophilic microgel.

DETAILED DESCRIPTION OF THE INVENTIVE SUBJECT MATTER

Figure 1:
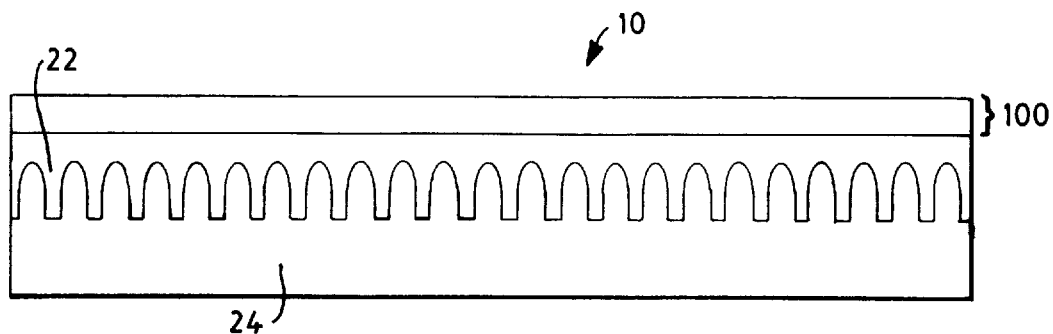
FIG. 1 is a schematic representation of an overcoated lithographic plate 10 according to a preferred product embodiment of the present invention, the plate being shown prior to imagewise exposure to actinic radiation.

By the present invention, there is provided a method for lithographically printing images on a receiving medium (e.g., paper) from a suitably designed "expose-only", "no-process", or "on-press developable" lithographic plate.

Central to the methodology of the present invention is the incorporation of a disperse hygroscopic microgel into the photosensitive layer of a lithographic plate. In this regard, the term "microgel" relates to solvent-insoluble, crosslinked spherical polymer particles, with a particle size of about 0.05 to 1 μm in diameter. In explanation of—but not to limit—the present invention, the disperse hygroscopic microgel enhances the durability of the resultant photosensitive layer, while providing discrete submicron hydrophilic domains that facilitate the application and permeation of lithographic fountain solution therethrough, promoting more rapid on-press development. As observed in the Examples, infra, the incorporation of hygroscopic microgel into the photosensitive layer of an on-press developable lithographic plate provides several advantages: 1) the plates are less tacky; 2) the plates "clean up" more quickly, even after accelerated aging; and 3) the plates give better resolution and sharper contrast, with a significant reduction of "plugging" defects (i.e., in the 20 to 50% shadow dot area) manifest in certain configurations.

Practice of the inventive methodology commences initially with the provision of a photosensitive composition comprising at least a photopolymerizable, photocrosslinkable, or photorearrangeable compound, the compound having dispersed therein the hygroscopic microgel.

The microgel can be prepared by conventional inverse emulsion polymerization techniques, utilizing one or more monomers (approx. 90 to 99.5% by weight), crosslinking agents (approx. 0.5 to 10% by weight), suitable emulsifiers (approx. 0.25 to 4% by total weight of reactants), and initiators (approx. 0.05 to 5% by weight of monomers).

Suitable monomers include acrylamide, methacrylamide, vinyl pyrrolidone, 2-hydroxyethyl acrylate, 2-hydroxyethyl methacrylate, polyethylene glycol monoacrylate, polyethylene glycol monomethacrylate, N-alkyl acrylamide, N-alkyl methacrylamide, acrylic acid, methacrylic acid, vinyl pyridine, N,N-dialkylaminoethyl acrylate, N,N-dialkylaminoethyl methacrylate, vinyl sulfonic acid, styrene sulfonic acid, diallyldialkylammonium, and salts of the above-mentioned monomers. Monomers such as alkyl acrylate, alkyl methacrylate, styrene, acrylonitrile, butadiene, maleic anhydride and their derivatives may also be used as comonomers.

A preferred crosslinking agent is N,N'-alkylene bisacrylamide, such as N,N'-methylene bisacrylamide; while others include butanediol diacrylate, ethylene glycol dimethacrylate, tetramethylene glycol diacrylate, trimethylol propane triacrylate, tetraethylene glycol dimethacrylate, methylene bismethacrylamide, divinyl benzene, vinyl methacrylate, trivinyl benzene, glycerine trimethacrylate, pentaerythritol tetramethacrylate, triallyl cyanurate, divinyl acetylene, divinyl ethane, divinyl sulfide, divinyl sulfone, hexatriene, triethylene glycol dimethacrylate, diallyl, cyanimide, glycol diacrylate, ethylene glycol divinyl ether, diallylphthalate, divinyl dimethyl silane, glycerol trivinyl ether, and the like.

Conventional anionic, cationic or nonionic emulsion stabilizers and water soluble initiators can be employed. Examples include sodium lauryl sulfate, lauryl pyridine chloride, polyoxyethylene, polyoxypropylene, colloidal silica, anionic organic phosphates, magnesium montmorillonite, the reaction product of 12 to 13 moles of ethylene oxide with 1 mole of octyl phenol, secondary sodium alkyl sulfates and mixtures thereof. Preferred stabilizers are the polymeric dispersants available from ICI under the product designation Hypermer, such as Hypermer B246; and ethylene oxide-propylene oxide block copolymers from BASF, such as Pluronic surfactants having HLB values between 4 and 13.

Examples of initiators are potassium persulfate, sodium persulfate, ammonium persulfate, tertiary butyl hydroperoxide, hydrogen peroxide, azobis(isobutyronitrile), azobis(isobutyroimidine hydro chloride), various redox (reduction-oxidation) systems such as hydrogen peroxide and ferrous sulfate and well-known persulfate-bisulfate combinations.

The dry microgel should be configured to have a glass transition temperature, $T_g$, greater than room temperature. To provide the aforediscussed hydrophilic pathways important to penetration of lithographic fluid through the photosensitive layer, the surface of the polymeric particulate beads should manifest suitable hydrophilicity. To promote shelf-life stability and maintain good resolution and durability, the beads should be sufficiently crosslinked and sufficiently incompatible with said photopolymerizable, photocrosslinkable, or photorearrangeable compound to prevent substantial swelling of said beads in said compound. Likewise, the microgel should also be insoluble in the lithographic fountain solution selected for use on the press.

As stated, in addition to the microgel component, the photosensitive composition also comprises a photopolymerizable, photocrosslinkable, or photorearrangeable compound capable of promoting photosolubilization, photohardening, or photodifferentiation of the resultant photosensitive layer 22 in areas of exposure to actinic radiation. Typically and preferably, the ingredients of the photosensitive composition are formulated in an organic solvent, such as methyl ethyl ketone. As a solvent-based resist, when developed on-press, remnants of the removed resist will be "taken up" by the press ink solution. Accordingly, contamination of the press fountain solution (and the concomitant degradation of print quality) is avoided. Details in respect of the photopolymerizable, photocrosslinkable, or photorearrangeable compound are provided further below.

After preparation of the microgel-containing photosensitive composition, the composition is then deposited onto a suitable substrate 24 to provide a photosensitive layer 22 thereon. If properly prepared, the photosensitive layer 22 should be capable of being photohardened, photoinsolubilized, or photodifferentiated upon imagewise exposure to actinic radiation.

If it is desired for reasons dictated by a particular application that the photosensitive layer remains somewhat "tacky", such as when concerns of developability override those of run length, the desire can be met by a suitably reduced incorporation of microgel. To offset the heightened tackiness, a polymeric on-press removable overcoat 100 can be deposited atop the photosensitive layer 22. Useful overcoat configurations are described in U.S. Pat. No. 5,599,650.

Figure 2:
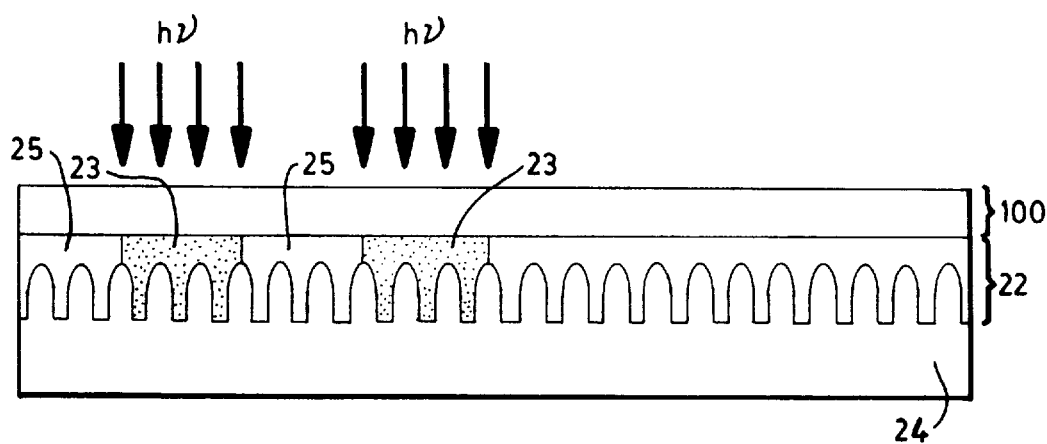
FIG. 2 schematically illustrates the overcoated lithographic plate 10 of FIG. 1 during imagewise exposure of photoresist layer 22 to actinic radiation, hv, the exposure being conducted through an on-press removable polymeric overcoat 100.

The photosensitive layer 22 is then imagewise exposed to actinic radiation. (As shown in FIG. 2, if an on-press removable overcoat is utilized, imagewise exposure is conducted through the overcoat.) Depending on its formulation, the actinic radiation causes exposed areas of the photoresist layer to imagewise "harden", "solubilize" (i.e., "soften"), or otherwise differentiate, as an immediate or indirect result of the photopolymerization, photocrosslinking, or photorearrangements of its constituent components. Actinic radiation exposure thus produces an imagewise differentiation in said photosensitive layer.

Figure 3:
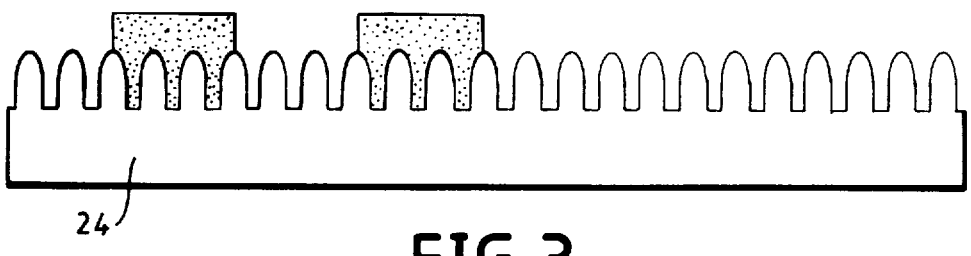
FIG. 3 illustrates the lithographic plate of FIG. 1 after development, and subsequent to the exposure shown in FIG. 2, whereby polymeric overcoat 100 and unexposed regions 25 of photoresist layer 22 have been removed. In accord with method aspects the present invention, development is occasioned "on-press".

The exposed lithographic plate is then mounted directly onto a lithographic printing press for the conduct of a printing operation Printing is occasioned without requirement of an intermediate wet bath development step or other like prepress processing. Instead, during the printing run, the imagewise differentiated photosensitive layer 22 contacts and is submitted to the influence of lithographic fountain and ink solution. Applied over the surface of the photosensitive layer 22—removing the on-press removable overcoat 100 if one was utilized—the fountain solution in time penetrates the photosensitive layer 22 (facilitated by the hydrophilic pathways effected by said hydrophilic surfaces of said crosslinked polymeric particulate beads), and thereby effects a washing or rinsing of said layer. As shown in FIG. 3, in negative-working plates, the fountain and ink solutions typically effect removal of unexposed areas 25 of the photoresist layer 22, thus correspondingly baring the underlying substrate 24. Ink collects ultimately on either exposed or unexposed areas of the photosensitive layer 22 (depending on whether said layer is positive-working or negative-working) and is then transferred to a receiving medium, such as paper.

In a particular mode of practice, the printing plate 10 is mounted on the plate cylinder of an offset lithographic press which, as it rotates, comes into contact successively with rollers wet by a fountain solution and rollers wet by ink. The fountain and ink solution (sprayed or otherwise deposited onto dampening rollers and inking rollers, respectively) contacts the plate, leading to the aforediscussed interaction of the fountain and ink solutions with the photosensitive layer. The fountain solution contacts the non-printing areas of the plate and prevents ink from contacting these areas. The ink likewise contacts the image areas and is subsequently transferred to an intermediate blanket cylinder. The ink image is then transferred to the receiving medium (e.g., paper) as it passes between the intermediate blanket cylinder and an impression cylinder.

In preferred embodiments of the present invention, the photosensitive layer 22 is designed as a photohardenable photoresist that—aside from the microgel component—comprises at least a binder, a polymerizable monomer, and an initiator.

The polymerizable monomer may include any variety of compounds, mixtures, or mixtures of reaction compounds or materials capable of being physically altered by photoexposure or of promoting physical alteration (e.g., hardening) of the properties of the layer in areas of photoexposure. Compounds and materials suitable for this purpose include monomeric photopolymerizable compounds which undergo free-radical or cation-initiated polymerization. A large number of useful compounds is available, generally characterized by a plurality of terminal ethylenic groups.

Especially preferred for promoting photohardening of polymeric resist layer is a polymerizable monomer which forms a macromolecular or polymeric material upon photoexposure, preferably a photopolymerizable ethylenically unsaturated monomer having at least one terminal ethylenic group capable of forming a high polymer by free-radical initiated, chain-propagated polymerization. Examples of such unsaturated compounds include acrylates, acrylamides, methacrylates, methacrylamides, alkyd compounds, vinyl ethers, vinyl esters, N-vinyl compounds, styrene, crotonates and the like. Polymerization can be effected by using a photoinitiator, such as a free-radical generating, addition polymerization-initiating system activatable by actinic radiation. Such initiating systems are known and examples thereof are described below.

Preferred polymerizable monomers are the polyfunctional acrylate monomers such as the acrylate and methacrylate esters of ethylene glycol, trimethylolpropane and pentaerythritol. These can be polymerized in exposed regions of a polymeric photoresist in the presence of a photoinitiator. Suitable photoinitiators include the derivatives of acetophenone (such as 2,2-dimethoxy-2-phenylacetophenone), benzophenone, benzil, ketocoumarin (such as 3-benzoyl-7-methoxy coumarin), xanthone, thioxanthone, benzoin or an alkyl-substituted anthraquinone, diaryl iodonium salt, triaryl sulfonium salts, azobisisobutyronitrile and azo-bis-4-cyanopentanoic acid, although others can be employed.

The practical concentration of the monomer or monomers employed is about 7.5%–70% by weight based on the total solids of the composition, and preferably between 15–40%.

Another principal component of the polymeric photoresist for most plates is a solvent-soluble hydrophobic binder of suitable oleophilicity and ink receptivity. Suitable binder materials include: vinylidene chloride copolymers (e.g., vinylidene chloride/acrylonitrile copolymers, vinylidene chloride/methylmethacrylate copolymers and vinylidene chloride/vinyl acetate copolymers); ethylene/vinyl acetate copolymers; cellulose esters and ethers (e.g., cellulose acetate butyrate, cellulose acetate propionate, and methyl, ethyl benzyl cellulose); synthetic rubbers (e.g., butadiene/acrylonitrile copolymers; chlorinated isoprene and 2-chloro-1,3-butadiene polymers); polyvinylesters (e.g., vinyl acetate/acrylate copolymers, poly(vinyl acetate) and vinyl acetate/methylmethacrylate copolymers); acrylate and methacrylate copolymers (e.g., polymethylmethacrylate); vinyl chloride copolymers (e.g., vinyl chloride/vinylacetate copolymers); and diazo resins such as the formaldehyde polymers and copolymers of p-diazo-diphenylamine.

The photoresist composition can be suitably coated or otherwise deposited into a layer which, upon photoexposure, undergoes hardening as the result of polymerization of the polymerizable monomer and grafting of the monomer onto the polymeric binder. If desired, other crosslinking agents, such as bis-azides and polythiols, can be included to promote crosslinking of the polymerizable monomers or the binders.

If desired, preformed polymers having pendant pyridium ylide groups, which groups, upon photoexposure, undergo ring expansion (photorearrangement) to a diazepine group with accompanying insolubilization can also be blended with the photoreactive polymer of this invention. Examples of polymers having such pyridium ylide groups are set forth in U.S. Pat. No. 4,670,528, issued to L. D. Taylor and M. K. Haubs on Jun. 2, 1987.

For other photosensitive compositions, rearrangement need not be intramolecular. Intermolecular rearrangement (essentially, photoinduced compound modification) is also contemplated. For example, a compound comprising a polymer with pendant acid labile group and a photoacid generator will undergo a rearrangement of sorts upon exposure to actinic radiation. Particularly, upon exposure acids are generated that cleave the labile groups from said polymer, modifying the overall properties of said compound. Examples of such system can be found in U.S. Pats. Nos. 5,395,734, 5,225,316, and 5,102,771.

To prepare a lithographic plate for use in the present invention, the photosensitive composition is coated or otherwise deposited as a layer onto a substrate 24. Certain factors are considered in determining the appropriate materials for the substrate 24. Such factors vary with the particular lithographic needs of individual projects and are believed to be within the grasp of one skilled in the pertinent art. Regardless, for most lithographic needs envisioned, suitable substrates will generally include those to which the photosensitive layer 22 can be adhered adequately, prior to photoexposure, and to which photoexposed printing (image) areas are adhered after photoexposure. Other pertinent considerations may be extrapolated on the basis of the present disclosure.

In practice, substrate materials for use in the manufacture of printing plates will oftentimes be subjected to one or more treatments in order to improve adhesion of the photosensitive layer, or to increase the hydrophilic properties of the substrate material, and/or to improve the developability of the photosensitive coating, as is described in the U.S. Pat. No. 4,492,616 (issued Jan. 8, 1985 to E. Pliefke, et al.). Thus, the substrate 24 can be treated (for example, by polyvinylphosphonic acid or silicate or by anodization, or by corona discharge or plasma treatment, or by roughening or graining treatment) to promote desired adhesion of any photosensitive layers.

Especially preferred substrates are the metallic substrates of aluminum, zinc, or steel. Other preferred substrates are silicone rubbers and metallized plastic sheets such as those based on poly(ethylene terephthalate).

Preferred aluminum substrates are the grained, anodized aluminum plates, where the surface of the plate is roughened mechanically or chemically (e.g., electrochemically) by a combination of roughening treatments. Anodized plates can be used to provide an oxide surface. Other desirable plates are anodized aluminum plates which, for example, have been treated with polyvinylphosphonic acid or otherwise provided with a resinous or polymeric hydrophilic layer.

Examples of printing plate substrate materials which can be used in the production of printing plates of the invention, and methods of graining and hydrophilizing such substrates are described, for example, in U.S. Pat No. 4,153,461 (issued May 8, 1979 to G. Berghäuser, et al.); the aforementioned U.S. Pat. No. 4,492,616 issued to E. Pliefke, et al; U.S. Pat. No. 4,618,405 (issued Oct. 21, 1986 to D. Mohr, et al.); U.S. Pat. No. 4,619,742 (issued Oct. 28, 1986 to E. Pliefke); and U.S. Pat. No. 4,661,219 (issued Apr. 28, 1987 to E. Pliefke).

It is common practice in preparing photosensitive compositions to employ photosensitizers, coinitiators, and activators. Photosensitizers and coinitiators are relied upon to capture photons of exposing radiation. They may absorb light of different wavelengths from the principal photoinitiator. The activator in contrast is not relied upon to respond directly to exposing radiation, but rather adjacent activator and photosensitizer molecules react, following excitation of the latter by photon capture, causing release of a free radical which in turn induces immobilization addition reactions at sites of ethylenic unsaturation.

Photoexposure of the printing plate can be accomplished according to the requirements dictated by the particular composition of the photosensitive layer 22 and the thickness thereof. In general, actinic irradiation from conventional sources can be used for photoexposure, for example, relatively long wavelength ultraviolet irradiation or visible irradiation. UV sources will be especially preferred and include carbon arc lamps, "D" bulbs, Xenon lamps and high pressure mercury lamps.

The thickness of the photosensitive layer 22 can vary with the particular requirements. In general, it should be of sufficient thickness to provide a durable photohardened printing surface. Thickness should be controlled, however, such that it can be exposed within exposure-time requirements and should not be applied at a thickness that hampers ready removal of the layer in exposed (or non-exposed) areas by developers. It will be appreciated, as stated above, that the use of the dispersed microgel of the present invention enables the use of comparatively thinner photosensitive layers. When utilizing an anodized, grained aluminum substrate, good results are obtained by using a polymeric photoresist having coverage of about 80 mg/ft$^2$ to 120 mg/ft$^2$ depending on the microstructure 26 of the grained substrate.

The photosensitive layer 22 can be provided with colorants, e.g., tint dyes, to provide a desired and predetermined visual appearance. Especially preferred will be a colorant, or a precursor of a species, respectively, capable either of being rendered colorless, or being provided with coloration by the irradiation of the plate-making photoexposure step. Such dye or dye-precursor compounds and the light absorption differences promoted by the photoexposure allow the platemaker to distinguish readily the exposed from the non-exposed regions of the plate in advance of mounting and running the photoexposed plate on a printing press.

The operability of the photosensitive layer 22 may be improved by the addition of certain additives. For example, the photosensitive layer 22 can contain plasticizers, additional hardeners, or other agents to improve coatability. The photosensitive layer 22 may also contain antioxidant materials to prevent undesired (premature) polymerization and examples include derivatives of hydroquinone; methoxy hydroquinone; 2,6-di-(t-butyl)-4-methylphenol; 2,2'-methylene-bis-(4-methyl-6-t-butylphenol); tetrakis {methylene-3-(3',5'-di-t-butyl-4'-hydroxyphenyl) propionate} methane; diesters of thiodipropionic acid, triarylphosphite. While the use of such additives is unnecessary for the operability of the present invention, incorporation of such additives may dramatically enhance performance.

While on-press developable plate embodiments of the present invention are suitable for many printing applications, they can be improved in respect of on-press developability by suitably modifying the photoresist composition or treating the photoresist layer for improved removability on the press. For example, good results may be accomplished by combining the teachings herein with those set forth in U.S. Pat No. 5,516,620 and commonly assigned U.S. Pat. Nos. 5,561,029; 5,599,650; and 5,6778,108. The photoresist layer 22 may also incorporate a plasticizing system and a photoreactive polymeric binder, as described in U.S. Pat. No. 5,607,876 and U.S. Pat. No. 5,514,522. Combinations with these on-press development systems and those described in the other patent applications cross-referenced herein are the suggested modes of utilization.

The present invention will now be described in further detail by the following non-limiting examples of several of its embodiments. In the Examples, the term "Clean" means that non-exposed areas (or background), $G_{min}$, are completely removed after on-press development, and that no ink is picked up in the exposed background areas. The term "Not Clean" indicates "scumming", or in other words, non-exposed areas are not completely removed, a substantial amount of ink accumulating in these areas. The term "Almost Clean" indicates that the background is mostly clean, but that a noticeable quantity of ink collects in the background. "Not clean" and "almost clean" are used in reference to the clarity of the background. The term "Undeveloped" means that non-imaged areas remain unremoved, ink collecting throughout the entire surface of the plate regardless of whether the area is exposed or not. The term "Blinding" indicates that although the background is "clean", poor ink receptability is evident in exposed areas. The term "Plugging" indicates that, although the background is "clean", certain shadow dots (i.e., holes and space between dots) are "unopened" in the half tone areas at a frequency of around 50% (20–70%). The term "Reverse Image" indicates that the image areas do not pick up ink; rather, ink is localized in the non-exposed areas. The term "Toning" indicates loss of hydrophilicity in non-exposed areas after the plate development (i.e., non-exposed areas completely removed). Ink collects slightly on non-exposed areas, the prints revealing a grayish background. The term "NA" means that data was not collected.

EXAMPLES

Example 1

A microgel (MG) composition was prepared using a conventional inverse emulsion polymerization protocol and the recipe set forth in the following Table 1-A:

TABLE 1-A

| Preparation of Microgel Composition | |
|---|---|
| Component | Wt(g) |
| Disperse Aqueous Phase: | |
| H$_2$O | 33.5 |
| Acrylamide | 34.5 |
| N,N'-methylene bisacrylamide | 2 |
| Continuous Organic Phase: | |
| Xylene | 100 |
| Acrylamide | 0.5 |
| Hypermer B246 (a polymeric surfactant from ICI) | 5 |
| Initiator Solution: | |
| Xylene | 10 |
| Azobisisobutyronitrile, MBN | 0.018 |

More particularly, the components comprising the Organic Phase were first purged with N$_2$ for 30 minutes. The Initiator Solution was added and the mixture stirred at 60° C. at a rate of 220 rpm. After 20 minutes, the components comprising aqueous phase were added dropwise at a rate of 1 drop approximately every 2 to 4 seconds. Stirring proceeded for about 4 hours in total.

The resultant microgel composition was analyzed using conventional light scattering techniques and determined to have particles having diameters ranging from about 0.1 to 0.5 μm.

A microgel composition (prepared as above) was subsequently incorporated into a photoresist composition (i.e., Resist 1). A photoresist composition identical to Resist-1 except for the absence of the microgel component was also prepared (i.e., Control-1). The particular recipes (in % film solids) for both the photoresist composition and the control are set forth in the following Table 1-B:

TABLE 1-B

Preparation of Microgel-Containing
and Comparative ("Control") Photoresist Compositions

| Component | Resist-1 | Control-1 |
|---|---|---|
| Acryloid Resin A-11; a polymethylmethacrylate from Rohm & Haas | 6.48 | 8.98 |
| Acryloid Resin B-72; a poly(ethylmethacrylate-co-methylacrylate) from Rohm & Haas | 13.99 | 16.49 |
| Microgel; See Table 1-A, supra | 5.00 | 0.00 |
| Ebecryl 8301; a hexafunctional urethane acrylate oligomer from Radcure | 17.74 | 17.74 |
| PU 788; a difunctional polyurethane acrylate from Morton, Inc. | 8.20 | 8.20 |
| Trimethylolpropane triacrylate | 13.34 | 13.34 |
| 20% Cab-o-sil M5 silica in Ebecry 8301 | 15.00 | 15.00 |
| 3-benzoyl-7-methoxy coumarin | 1.40 | 1.40 |
| 4-benzoyl-4-methyl diphenyl sulfide | 1.80 | 1.80 |
| Pluronic L43; a nonionic surfactant from BASF; i.e., a block copolymer of ethylene oxide and proplyene oxide (HLB: 12.0). | 5.00 | 5.00 |
| Triethylene glycol diacetate | 5.00 | 5.00 |
| s-triazene$^a$ | 2.50 | 2.S0 |
| Lithium Chloride | 0.62 | 0.62 |
| Leuco Crystal Violet | 3.30 | 3.30 |
| 2,6-di-tert-butyl-4-methyl phenol (BHT) | 0.48 | 0.48 |
| Irganox 1035; an antioxidant from Ciba-Geigy; i.e., thiodiethylene bis-(3,5-di-tert-butyl-4-hydroxy) hydrocinnamate | 0.17 | 0.17 |
| % Coating Solution | 4.80 | 4.80 |

Notes: $^\beta$: 2-[p-(n-heptylaminocarbonyl)phenyl]-4,6-bis(trichloromethyl)-1,3,5-triazine, see U.S. Pat. No. 5,561,029

The photoresist composition was then deposited onto grained aluminum substrates at a coverage of about 100–110 mg/ft$^2$, spin-coated at 200 rpm, and dried.

Plates based on Resist-1 (Example 1 plates) and those based on Control-1 (Control-1 plates) were exposed at 5 levels of exposure: 8, 12, 16, 20, 24 LU. The plates were mounted onto a lithographic printing press and run. Samples were collected after 20 fountain and 10 ink revolutions.

Figure 4A:
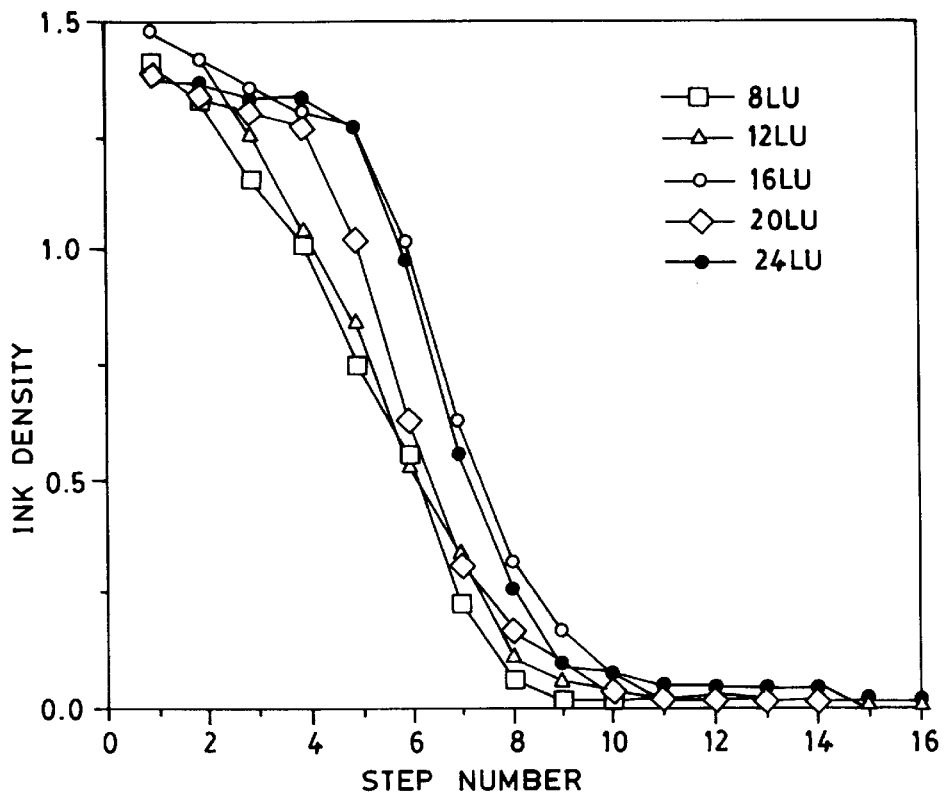
FIG. 4(a) is graph plotting "ink density" against "step number" (2 steps/stop) for samples of "microgel-absent" lithographic plates exposed at varying light intensities. The graph is explained in Example 1, infra.
Figure 4B:
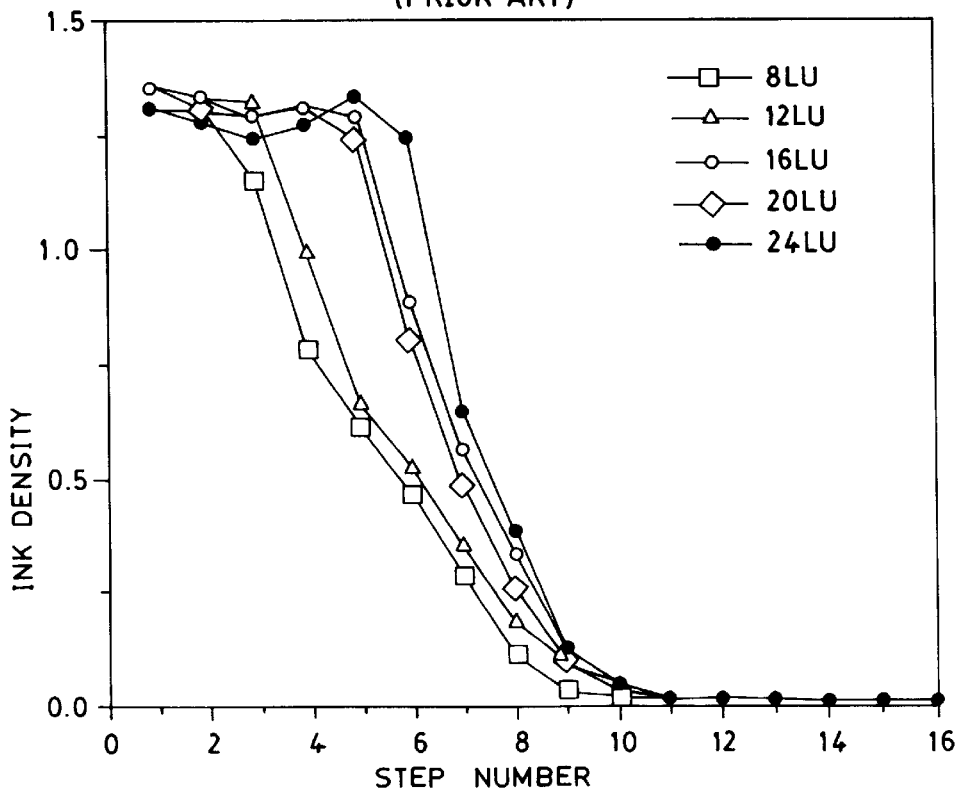
FIG. 4(b) is graph plotting "ink density" against "step number" for samples of "microgel-containing" lithographic plates exposed at varying light intensities. The graph is explained in Example 1, infra.
Figure 5A:
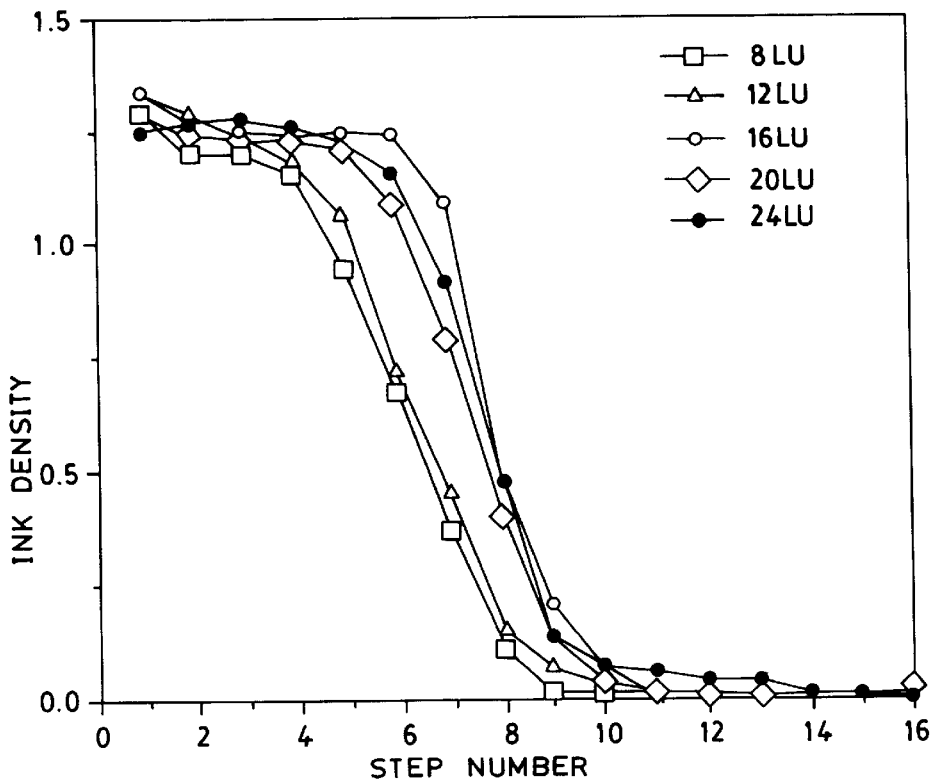
FIG. 5(a) is graph plotting "ink density" against "step number" for the samples of "microgel-absent" lithographic plates mentioned in the brief description of FIG. 4(a), after 100 impressions, exposed at varying light intensities. The graph is explained in Example 1, infra.
Figure 5B:
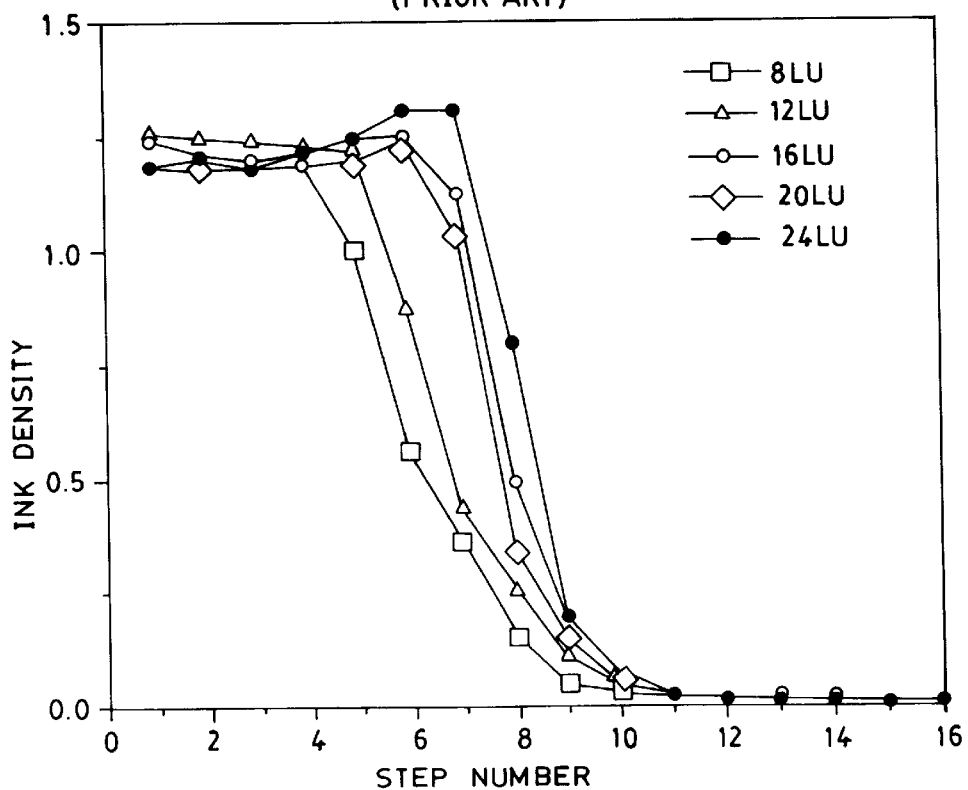
FIG. 5(b) is graph plotting "ink density" against "step number" for the samples of "microgel-containing" lithographic plates mentioned in the brief description of FIG. 4(b), after 100 impressions, exposed at varying light intensities. The graph is explained in Example 1, infra.

Measurements of ink density (see FIGS. 4($a$) and 4($b$), 4($a$) being the control) at the different exposures on an UGRA step wedge show that plates containing microgels give cleaner $D_{min}$ areas, even after 100 impressions (see corresponding FIGS. 5($a$) and 5($b$)). The Example 1 plates also provide sharper contrast ($\gamma$) as compared to the Control-1 plates. The ink density at $D_{max}$ is comparable in both cases. Tackiness of the plate is greatly reduced in the Example 1 plates.

Example 2

A microgel composition was prepared in accordance with the microgel preparation protocol set forth in Example 1.

The microgel composition was incorporated into a photoresist composition (i.e., Resist-2). For comparison, a photoresist composition identical to Resist-2 except for the absence of the microgel component was also prepared (i.e., Control-2). The particular recipes (in % film solids) for both the photoresist composition and the control are set forth in the following Table 2-A:

TABLE 2-A

Preparation of Microgel-Containing
and Comparative ("Control") Photoresist Compositions

| Component | Resist-2 | Control-2 |
|---|---|---|
| Acryloid Resin A-11; i.e., a polymethylmethacrylate from Rohm & Haas | 5.89 | 6.72 |
| Acryloid Resin B-72; i.e., a poly(ethylmethacrylate-co-methylacrylate) from Rohm & Haas | 11.91 | 13.57 |
| Photoreactive Acrylic Binder$^\alpha$ | 17.80 | 20.29 |
| Microgel; See Table 1-A, supra | 5.00 | 0.00 |
| Sartomer SR399; i.e., dipentaerythritol pentaacrylate | 47.57 | 47.57 |
| 3-benzoyl-7-methoxy coumarin | 1.28 | 1.28 |
| Pluronic IA3; a nonionic surfactant from BASF; i.e., a block copolymer of ethylene oxide and propylene oxide (HLB: 12.0). | 4.44 | 4.44 |
| s-triazene$^\beta$ | 2.31 | 2.31 |
| Leuco Crystal Violet | 3.18 | 3.18 |
| 2,6-di-tert-butyl-4-methyl phenol (BHT) | 0.47 | 0.47 |

TABLE 2-A-continued

Preparation of Microgel-Containing
and Comparative ("Control") Photoresist Compositions

| Component | Resist-2 | Control-2 |
|---|---|---|
| Irganox 1035; an antioxidant from Ciba-Geigy; i.e., thiodiethylene bis-(3,5-di-tert-butYl-4-hydroxy) hydrocinnamate | 0.16 | 0.16 |
| % Coating Solution | 5.95 | 5.95 |

Notes: $^\alpha$: The photoreactive acrylic binder contains methyl methacrylate, butyl methacrylate, maleic anhydride, and TMI adduct with hydroxybutyl acrylate. See, U.S. Pat. App. No. 08/147,045; and and U.S. Pat. No. 5,514,522; $^\beta$: 2-[p-(n-heptylaminocarbonyl)phenyl]-4,6-bis(trichioromethyl)-1,3,5-triazine.

As in Example 1, the compositions were deposited onto a grained aluminum substrates at a coverage of about 100–110 mg/ft$^2$, spin-coated at 200 rpm, and dried.

When used on-press, the Control-2 plates did not clean up on the first page, whereas the Example 2 plates "cleaned up" relatively immediately. It was also observed that after 20 fountain revolutions and the first ink revolution, the Control-2 plates were mostly covered with ink with no discernible image, whereas the Example 2 plates showed entirely clean backgrounds. From these observations, it can be concluded that the presence of microgels facilitates the development of the plate.

Aside from developability, resolution was also analyzed, the results of such analysis being tabulated in the following Table 2-B.

As another notable improvement, it was observed that in the Example 2 Plates, the incidence of "plugging" phenomenon—prevalent in Control-2 plates—is virtually eliminated, even on the first page printed from a plate exposed at the highest exposure. Further, the Example 2 plates are generally non-tacky and do not adhere to the exposure mask.

Example 3

A microgel composition was prepared in accordance with the microgel preparation protocol set forth in Example 1.

The microgel composition was subsequently incorporated into a photoresist composition (i.e., Resist-3). For comparison, a photoresist composition identical to Resist-3 except for the absence of the microgel component was also

TABLE 2-B

Resolution of "Example 2 Plate" and
"Control-2 Plate" after 100 Impressions.

| Example 2 plates (5% Microgel) | | | | | | Control-2 plates (No Microgel) | | | | | |
|---|---|---|---|---|---|---|---|---|---|---|---|
| LU | Gmax | Hi | Sh | Hi$\mu$ | Sh$\mu$ | LU | Gmax | Hi | Sh | Hi$\mu$ | Sh$\mu$ |
| 8 | 4 | 1 | 80 | 4 | 20 | 8 | 5 | 1 | 80 | 4 | 25 |
| 12 | 5 | 1 | 80 | 4 | 25 | 12 | 5 | 1 | 80 | 4 | 25 |
| 16 | 5 | 1 | 80 | 4 | 25 | 16 | 7 | 1 | 80 | 4 | 30 |
| 20 | 6 | 1 | 80 | 4 | 25 | 20 | 7 | 1 | 70 | 4 | 30 |
| 24 | 6 | 1 | 80 | 4 | 30 | 24 | 7 | 1 | 70 | 4 | 30 |

Notes:
LU: Exposure light unit; Gmax: Step number to reach maximum ink density; Hi: % Highlight dot; Sh; % Shadow dot; Hi$\mu$: Highlight microline; Sh$\mu$: Shadow microline.

As shown, the Example-2 plates have better resolution than the Control-2 plates at several different exposures, especially in the shadow areas.

prepared (i.e., Control-3). The particular recipes (in % film solids) for both the photoresist composition and the control are set forth in the following Table 3-A:

TABLE 3-A

Preparation of Microgel-Containing
and Comparative ("Control") Photoresist Compositions

| Component | Resist-3 | Control-3 |
|---|---|---|
| Acryloid Resin B-72; i.e., a poly(ethylmethacrylate-co-methylacrylate) from Rohm & Haas | 26.05 | 29.03 |
| Photoreactive Acrylic Binder$^\alpha$ | 4.18 | 4.66 |
| Elvacite 2041, i.e., a high molecular weight poly(ethyl methacrylate) from E.I. du Pont. | 13.53 | 15.08 |
| Microgel; See Table 1-A, supra | 5.00 | 0.00 |
| Sartomer SR399; i.e., dipentaerythritol pentaacrylate | 30.72 | 30.72 |
| Sartomer SR9008; i.e., alkoxylated trifunctional actylate ester | 6.56 | 6.56 |
| 3-benzoyl-7-methoxy coumarin | 2.06 | 2.06 |

TABLE 3-A-continued

Preparation of Microgel-Containing
and Comparative ("Control") Photoresist Compositions

| Component | Resist-3 | Control-3 |
|---|---|---|
| 4-benzoyl-4-methyl diphenyl sulfide | 1.46 | 1.46 |
| Pluronic M3; a nonionic surfactant from BASF; i.e., a block copolymer of ethylene oxide and propylene oxide (HLB: 12.0). | 3.75 | 3.75 |
| s-triazene[β] | 1.21 | 1.21 |
| Sipomer; i.e., an allyl/ureido wet adhesion monomer from Rhone-Poulenc | 3.00 | 3.00 |
| Leuco Crystal Violet | 2.05 | 2.05 |
| 2,6-di-tert-butyl-4-methyl phenol (BHT) | 0.30 | 0.30 |
| Irganox 1035; an antioxidant from Ciba-Geigy; i.e., thiodiethylene bis-(3,5-di-tert-butyl-4-hydroxy) hydrocinnamate | 0.11 | 0.11 |
| % Coating Solution | 5.01 | 5.01 |

Notes: [α]: The photoreactive acrylic binder contains methyl methacrylate, butyl methacrylate, maleic anhydride, and TMI adduct with hydroxybutyl acrylate. See, U.S. Pat. App. Ser. No. 08/147,045; and U.S. Pat. No. 5,514,522; [β]: 2-[p-(n-heptylaminocarbonyl)phenyl]-4,6-bis(trichloromethyl)-1,3,5-triazine.

As in Example 1, the compositions were deposited onto a grained aluminum substrate at a coverage of about 100–110 mg/ft$^2$, spin-coated at 200 rpm, and dried.

When used on-press, the Control-3 plate did not clean up at the start, was very difficult to develop on press, and showed severe plugging and poor resolution even after 100 impressions. In contrast, the Example 3 Plate cleaned up relatively quickly, had no significant incidence of "plugging" and, as shown in the following Table 3-B, provided noticeably better resolution.

TABLE 3-B

Resolution of "Example 3 Plate" and "Control-3 Plate" after 100 Impressions.

| Example 3 plates (5% Microgel) | | | | | | Control-3 plates (No Microgel) | | | | | |
|---|---|---|---|---|---|---|---|---|---|---|---|
| LU | Gmax | Hi | Sh | Hi$\mu$ | Sh$\mu$ | LU | Gmax | Hi | Sh | Hi$\mu$ | Sh$\mu$ |
| 3 | 3 | 2 | 80 | 4 | 20 | 3 | 5 | 2 | 50 | 4 | 40 |
| 5 | 5 | 2 | 80 | 4 | 20 | 5 | 7 | 2 | 50 | 4 | 40 |
| 7 | 5 | 2 | 80 | 4 | 25 | 7 | 7 | 2 | 50 | 4 | 30 |
| 9 | 6 | 2 | 80 | 4 | 25 | 9 | 8 | 2 | 50 | 4 | 40 |
| 11 | 7 | 2 | 80 | 4 | 30 | 11 | 8 | 2 | 50 | 4 | 50 |

Notes:
LU: Exposure light unit; Gmax: Step number to reach maximum ink density; Hi: % Highlight dot; Sh; % Shadow dot; Hi$\mu$: Highlight microline; Sh$\mu$: Shadow microline.

Further, it was also observed that the Control-3 plates resulted in blotchy mid-tone areas on the UGRA scales, whereas the Example 3 plates resulted in comparatively uniform mid-tone steps.

Examples 4 and 5

(Nonionic Microgel and Microgel Complex)

A microgel composition (nonionic) was prepared using a standard inverse emulsion polymerization protocol and the recipe set forth in the following Table 4-A:

TABLE 4-A

Preparation of Nonionic Microgel Composition

| Componeut | Wt(g) |
|---|---|
| Disperse Aqueous Phase: | |
| H$_2$O | 67.0 |
| Acrylamide | 69.0 |
| N,N-methylene bisacrylamide | 4.0 |
| Continuous Organic Phase: | |
| Xylene | 100 |
| Acrylamide | 0.5 |
| Hypermer B246; a triblock polymeric surfactant from ICI | 5 |

TABLE 4-A-continued

Preparation of Nonionic Microgel Composition

| Component | Wt(g) |
|---|---|
| Initiator Solution: | |
| Xylene | 10.0 |
| Azobisisobutyronitrile, MBN | 0.036 |
| Batch Size | 366.0 |

To prepare a microgel complex, another batch of the above microgel composition was prepared, to which vinylphosphonic acid (VPA) was added at a concentration of 10 mol % relative to acrylamide content. (Water uptake tests—i.e., uptake of saturated water vapor (100% relative humidity) of a dried sample in a sealed beaker—confirmed the formation of the microgel complex.)

The microgel and microgel compositions were subsequently incorporated into a photoresist composition (i.e., Resist-4, containing microgel, and Resist-5, containing the microgel complex). For comparison, a photoresist composition identical to Resists-4 and -5 except for the absence of a microgel component was also prepared (i.e., Control-4). The particular recipes for the photoresist composition are as follows:

TABLE 4-B

Preparation of Microgel-Containing and Comparative ("Control") Photoresist Compositions

| Component | Resist-4 (MG only) | Resist-5 (MG/VPA) | Control-4 (No MG) |
|---|---|---|---|
| Acryloid Resin A-11; a polymethylmethacrylate from Rohm & Haas | 6.50 | 6.50 | 6.50 |
| Acryloid Resin B-72; i.e., a poly(ethylmethacrylate-co-methylacrylate) from Rohm & Haas | 14.00 | 14.00 | 14.00 |
| Photoreactive Acrylic Binder$^\alpha$ | 4.18 | 4.18 | 10.00 |
| Microgel; see Table 4-A, supra | 5.00 | 0.00 | 0.00 |
| Microgel/VPA Complex; see Table 4-A and related discussion, supra | 0.00 | 5.00 | 0.00 |
| Ebecryl 8301, a hexafunctional urethane acrylate from Radcure | 7.00 | 7.00 | 7.00 |
| Sartomer SR399; i.e., dipentaerythritol pentaacrylate | 43.05 | 43.05 | 48.05 |
| 3-benzoyl-7-methoxy coumarin | 1.40 | 1.40 | 1.40 |
| 4-benzoyl-4-methyl diphenyl sulfide | 1.80 | 1.80 | 1.80 |
| Pluronic L43; a nonionic surfactant from BASF; i.e., a block copolymer of ethylene oxide and propylene oxide (HLB: 12.0). | 4.80 | 4.80 | 4.80 |
| s-triazene$^\beta$ | 2.50 | 2.50 | 2.50 |
| Leuco Crystal Violet | 3.30 | 3.30 | 3.30 |
| 2,6-di-tert-butyl-4-methyl phenol (BHT) | 0.48 | 0.48 | 0.48 |
| Irganox 1035; an antioxidant from Ciba-Geigy; i.e., thiodiethylene bis-(3,5-di-tert-butyl-4-hydroxy) hydrocinnamate | 0.17 | 0.17 | 0.17 |
| % Coating Solution | 5.50 | 5.50 | 5.50 |

Notes:
$\alpha$: The photoreactive acrylic binder contains methyl methacrylate, butyl methacrylate, maleic anhydride, and TMI adduct with hydroxybutyl acrylate. See, U.S. Pat. App. Ser. No. 08/147,045; and U.S. Pat. No. 5,514,522;
$\beta$: 2-[p-(n-heptylacminocarbonyl)phenyl]-4,6-bis(trichloromethyl)-1,3,5-triazine.

As in Example 1, the compositions were deposited onto a grained aluminum substrate at a coverage of about 100 to 110 mg/ft$^2$, spin-coated at 200 rpm, and dried. The plates were then overcoated with a 0.25 $\mu$m thick on-press removable protective overcoat (See, in general, U.S. Pat. Nos. 5,561,029 and 5,599,650), thus providing Example 4 plates (MG only), Example 5 plates (MG/VPA complex), and the Control-4 plates (no MG). The plates were cut in half and stored for a day, half at room temperature, the other half in a 60° oven.

The plates were exposed, mounted onto a printing press, and run. Observations are provided in the following Table 4-C.

TABLE 4-C

| Plate | Post-Exposure Treatment | Observations at Start of Run | Observations after 100 Images | Observations after 500 Images |
|---|---|---|---|---|
| Control-4 (No MG) | Room Temp. | Plugging | Plugging | Clean |
| Control-4 (No MG) | 60° C./1 day | Not Clean | Plugging | Clean |
| Example 4 (MG) | Room Temp. | Clean | Clean | Clean |
| Example 4 (MG) | 60° C./1 day | Clean | Clean | Clean |
| Example 5 (MG/VPA) | Room Temp. | Clean | Clean | Clean |
| Example 5 (MG/VPA) | 60° C./1 day | Clean | Clean | Clean |

As apparent from Table 4-C, both the Example 4 plates (MG only) and the Example 5 plates (MG/VPA complex) provide better developability and aging performance than the Control-4 plates (No MG).

Example 6

(Nonionic Microgel)

A microgel composition was prepared in accordance with the method described for Example 4.

The resulting nonionic microgel composition was incorporated into a photoresist composition (i.e., Resist-6). For comparison, a photoresist composition identical to Resists-6 except for the absence of the microgel component was also prepared (i.e., Control-6). The particular recipes for the photoresist composition and the control are set forth in the following Table 6A:

TABLE 6-A

Preparation of Nonionic Microgel-Containing
and Comparative ("Control") Photoresist Compositions

| Component | Resist-6 (MG) | Control-6 (No MG) |
|---|---|---|
| Acryloid Resin A-11; a polymethylmethacrylate from Rohm & Haas | 6.50 | 6.50 |
| Acryloid Resin B-72; i.e., a poly(ethylmethacrylate-co-methylacrylate) from Rohm & Haas | 14.00 | 14.00 |
| Photoreactive Acrylic Binder$^\alpha$ | 10.00 | 10.00 |
| Microgel; see Table 4-A, supra | 5.00 | 0.00 |
| Ebecryl 8301, a hexafunctional urethane acrylate from Radcure | 6.33 | 6.97 |
| Sartomer SR399; i.e., dipentaerythritol pentaacrylate | 43.48 | 47.84 |
| 3-benzoyl-7-methoxy coumarin | 1.40 | 1.40 |
| Pluromic L43; a nonionic surfactant from BASF; i.e., a block copolymer of ethylene oxide and propylene oxide (HLB: 12.0). | 4.80 | 4.80 |
| s-triazene$^\beta$ | 2.50 | 2.50 |
| BisOMLEV$^\chi$ | 3.00 | 3.00 |
| Leuco Crystal Violet | 2.00 | 2.00 |
| 2,6-di-tert-butyl-4-methyl phenol (BHT) | 0.73 | 0.73 |
| Irganox 1035; an antioxidant from Ciba-Geigy; i.e., thiodiethylene bis-(3,5-di-tert-butyl-4-hydroxy) hydrocinnamate | 0.26 | 0.26 |
| % Coating Solution | 5.50 | 5.50 |

Notes: $^\alpha$: The photoreactive acrylic binder contains methyl methacrylate, butyl methacrylate, maleic anhydride, and TMI adduct with hydroxybutyl acrylate. See, U.S. Pat. App. Ser. No. 08/147,045; and U.S. Pat. No. 5,514,522; $^\beta$: 2-[p-(n-heptylaminocarbonyl)phenyl]-4,6-bis(trichloromethyl)-1,3,5-triazine; $^\chi$: bis-(4-diethylamino-o-tolyl)-4-diethylaminophenylmethane.

The photoresist compositions were deposited onto a grained aluminum substrate at a coverage of about 100 to 110 mg/ft$^2$, spin-coated at 200 rpm, and dried. The plates were then overcoated with a 0.25 μm thick on-press removable protective overcoat, thus providing Example 6 plates (MG), and Control-6 plates (No MG). The plates were halved, stored, and subsequently exposed in the manner set forth in Examples 4 and 5.

The plates were mounted onto a printing press and run. Observations are provided in the following Table 6-B.

TABLE 6-B

| Plate | Post-Exposure Treatment | Observations at Start of Run | Observations after 100 Images | Observations after 500 Images |
|---|---|---|---|---|
| Control 6 (No MG) | Room Temp. | Not Developed | Not Clean | n/a |
| " | 60° C./1 day | Not Developed | Not Developed | n/a |
| Example 6 (MG) | Room Temp. | Not Clean | Clean | Clean |
| " | 60° C./1 day | Not Developed | Not Developed | Clean |

Although aging performance is inconclusive as apparent from Table 6-B, the Example 6 plates (MG) provide overall better developability than the Control-6 plates (No MG).

Examples 7 to 13

(Anionic Microgel and Microgel Complex)

Microgel compositions were prepared using a standard inverse emulsion polymerization protocol and the recipes set forth in the following Table 7-A:

TABLE 7-A

Preparation of Anionic Microgel Composition

| Component | MG-1 wt (g) | MG-2 wt (g) | MG-3 wt (g) | MG-4 wt (g) |
|---|---|---|---|---|
| Disperse Aqueous Phase: | | | | |
| H$_2$O | 40.0 | 40.0 | 40.0 | 40.0 |
| Acrylamide | 31.05 | 25.88 | 17.25 | 8.63 |
| Acrylic Acid | 3.45 | 8.63 | 17.25 | 25.88 |
| N,N-methylene bisacrylamide | 2.0 | 2.00 | 2.0 | 2.0 |
| Continuous Organic Phase: | | | | |
| Xylene | 100 | 100 | 100 | 100 |
| Acrylamide | 0.5 | 0.5 | 0.5 | 0.5 |
| Hypermer B246; a triblock polymeric surfactant from ICI | 5.0 | 5.0 | 7.5 | 5.0 |

TABLE 7-A-continued

Preparation of Anionic Microgel Composition

| Component | MG-1 wt (g) | MG-2 wt (g) | MG-3 wt (g) | MG-4 wt (g) |
|---|---|---|---|---|
| Initiator Solution: | | | | |
| Xylene | 10.0 | 10.0 | 10.0 | 10.0 |
| Azobisisobutyronitrile, AIBN | 0.022 | 0.022 | 0.022 | 0.022 |
| Batch Size | 192.0 | 192.0 | 194.5 | 192.0 |

The microgel compositions MG-1 to MG-4 were subsequently incorporated into a photoresist composition (i.e., Resist-7 containing microgel MG-1, Resist-8 containing microgel MG-2; Resist-9 containing microgel MG-3, and Resist-10 containing microgel MG-4). For comparison, a photoresist composition identical to Resists-7 to -10, except for the absence of a microgel component, was also prepared (i.e., Control-7). The generic recipe for the photoresist compositions were identical to those provided in Table 4-A, supra.

The photoresist compositions were deposited onto grained aluminum substrate at a coverage of about 100 to 110 mg/ft$^2$, spin-coated at 200 rpm, and dried. The plates were then overcoated with a 0.25 $\mu$m thick on-press removable protective overcoat, thus providing Example 7 plates (MG-1), Example 8 plates (MG-2), Example 9 plates (MG-3); and Example 10 plates (MG-4), and Control-7 plates (No MG).

Example 11, 12, and 13 plates were also prepared. The Example 11 plates were identical to the Example 9 plates, except in the Example 11 plates MG-3 was complexed with vinylpyridine. The Example 12 plates were also identical to the Example 9 plates, but the MG-3 in the Example 12 plates were complexed with 4-vinylpyridinium chloride. Finally, the Example 13 plates were identical to the Example 10 plates, except that the Example 13 plates complex MG-4 with 4-vinylpyridinium chloride.

The plates were halved, stored, and subsequently exposed in the manner set forth in Examples 4 and 5.

The plates were mounted onto a printing press and run. Observations are provided in the following Table 7-B.

TABLE 7-B

Developability and Aging Performance of Anionic Microgel and Microgel Complexes

| Plate | Post-Exposure Treatment | Observations at Start of Run | Observations after 100 Images | Observations after 500 Images |
|---|---|---|---|---|
| Control-7 (No MG) | Room Temp. | Plugging | Plugging | Clean |
| Control-7 (No MG) | 60° C./1 day | Not Clean | Plugging | Clean |
| Example 7 (MG-1) | Room Temp. | Clean | Clean | Clean |
| Example 7 (MG-1) | 60° C./1 day | Undeveloped | Clean | Clean |
| Example 8 (MG-2) | Room Temp. | Clean | Clean | Clean |
| Example 8 (MG-2) | 60° C./1 day | Reverse Image | Clean | Clean |
| Example 9 (MG-3) | Room Temp. | Blinding | Clean | Clean |
| Example 9 (MG-3) | 60° C./1 day | Blinding | Clean | Clean |
| Example 10 (MG-4) | Room Temp. | Almost Clean | Clean | Clean |

TABLE 7-B-continued

Developability and Aging Performance of Anionic Microgel and Microgel Complexes

| Plate | Post-Exposure Treatment | Observations at Start of Run | Observations after 100 Images | Observations after 500 Images |
|---|---|---|---|---|
| Example 10 (MG-4) | 60° C./1 day | Not Clean | Almost Clean | Clean |
| Example 11 (MG-3/VPy) | Room Temp. | Blinding | Clean | Clean |
| Example 11 (MG-3/VPy) | 60° C./1 day | Blinding | Clean | Clean |
| Example 12 (MG-3/VPy.HCl) | Room Temp. | Almost Clean | Clean | Clean |
| Example 12 (MG-3/VPy.HCl) | 60° C./1 day | Blinding | Clean | Clean |
| Example 13 (MG-4/Vpy.HCl) | Room Temp. | Clean | Clean | Clean |
| Example 13 (MG-4/Vpy.HCl) | 60° C./1 day | Blinding | Clean | Clean |

As apparent from Table 7-C, all the microgel-containing plates (i.e., Examples 7 to 13) show enhanced developability and aging performance, as compared to the Control-7 plate.

Examples 14 to 18

(Anionic Microgel and Microgel Complex)

Microgel compositions were prepared using a standard inverse emulsion polymerization protocol and the recipes set forth in the following Table 14-A:

TABLE 14-A

Preparation of Anionic Microgel Composition

| Component | MG-5 wt(g) | MG-6 wt(g) |
|---|---|---|
| Disperse Aqueous Phase: | | |
| H$_2$O | 40.0 | 29.5 |
| Acrylamide | 29.5 | 31.0 |
| AMPSA-NA$^+$; sodium 2-acrylamido-2-methylpropane sulfonate | 5.0 | 0.00 |
| VSA (25%); vinyl sulfonic acid, sodium salt | 0.0 | 14.0 |
| N,N-methylene bisacrylamide | 2.0 | 2.0 |
| Continuous Organic Phase: | | |
| Xylene | 100 | 100 |
| Acrylamide | 0.4 | 0.3 |
| Hypermer B24; a triblock polymeric surfactant from ICI | 2.5 | 2.5 |
| Initiator Solution: | | |
| Xylene | 10.0 | 10.0 |
| Azobisisobutyronitrile, AIBN | 0.022 | 0.022 |
| Batch Size | 189.4 | 189.3 |

The microgel compositions MG-5 and MG-6 were subsequently incorporated into a photoresist composition. For comparison, a photoresist composition identical to the microgel-containing resists, except for the absence of a microgel component, was also prepared. (The particular recipes for the photoresist compositions were identical to those provided in Table 6-A, supra.) The compositions were deposited onto grained aluminum substrates at a coverage of about 100 to 110 mg/ft$^2$, spin-coated at 200 rpm, and dried.

The plate was then overcoated with a 0.25 µm thick on-press removable protective overcoat, thus providing Example 14 plates (MG-5), Example 16 plates (MG-6), and Control-14 plates (No MG).

Example 15, 16, and 18 plates were also prepared. The Example 15 and 16 plates were identical to the Example 14 plates, except that MG-5 is complexed with 4-vinyl pyridinium chloride (50 mol % of the anionic monomer) in Example 15, and with 2-trimethylammoniumethyl methacrylate chloride (TMAEC) (50 mol % of the anionic monomer) in Example 16. The Example 18 plates were identical to the Example 16 plates, except MG-6 is complexed with TMAEC.

The plates were halved, stored, and subsequently exposed in the manner set forth in Example 1. The plates were mounted onto a printing press and run. Observations are provided in the following Table 14-B.

TABLE 14-B

Developability and Aging Performance of Anionic Microgel and Microgel Complexes

| Plate | Post-Exposure Treatment | Observations at Start of Run | Observations after 100 Images | Observations after 500 Images |
|---|---|---|---|---|
| Control-14 (No MG) | Room Temp. | Undeveloped | Not Clean | n/a |
| Control 14 (No MG) | 60° C./1 day | Undeveloped | Undeveloped | n/a |
| Example 14 (MG-5) | Room Temp. | Almost Clean | Clean | Clean |
| Example 14 (MG-5) | 60° C./1 day | Undevloped | Not Clean | Not Clean |
| Example 15 (MG-5/Vpy.HCl) | Room Temp. | Not Clean | Clean | n/a |
| Example 15 (MG-5/Vpy.HCl) | 60° C./1 day | Undeveloped | Undeveloped | n/a |
| Example 16 (MG-5/TMAEC) | Room Temp. | Not Clean | Clean | n/a |
| Example 16 (MG-5/TMAEC) | 60° C./1 day | Undeveloped | Undeveloped | n/a |
| Example 17 (MG-6) | Room Temp. | Not Clean | Almost Clean | n/a |
| Example 17 (MG-6) | 60° C./1 day | Reverse Image | Undeveloped | n/a |
| Example 18 (MG-6/TMAEC) | Room Temp. | Not Clean | Almost Clean | n/a |
| Example 18 (MG-6/TMAEC) | 60° C./1 day | Reverse Image | Undeveloped | n/a |

As apparent from Table 14-B, microgel-containing plates provide better developability that the microgel-absent plates. The Example 14 plates showed slight improvement in aging performance.

Examples 19 to 28

(Cationic Microgel and Microgel Complex)

Cationic microgel compositions were prepared using a standard inverse emulsion polymerization protocol and the recipes set forth in the following Table 19-A:

TABLE 19-A

Preparation of Cationic Microgel Composition

| Component | MG-7 wt(g) | MG-8 wt(g) |
|---|---|---|
| Disperse Aqueous Phase: | | |
| H₂O | 40.0 | 34.56 |
| Acrylamide | 29.5 | 31.0 |
| TMAEMC (75%) | 5.0 | 0.00 |
| 4-Vpy•HCL (30%) | 0.00 | 8.94 |
| N,N-methylene bisacrylamide | 2.0 | 2.0 |
| Continuous Organic Phase: | | |
| Xylene | 100 | 100 |
| Acrylamide | 0.4 | 0.3 |
| Hypermer B246; a triblock polymeric surfactant from ICI | 2.5 | 2.5 |
| Initiator Solution: | | |
| Xylene | 10.0 | 10.0 |
| Azobisisobutyronitrile, AIBN | 0.022 | 0.022 |
| Batch Size | 189.4 | 189.3 |

The microgel compositions MG-7 and MG-8 were subsequently incorporated into a photoresist composition. For comparison, a photoresist composition identical to the microgel-containing resists, except for the absence of microgel, was also prepared. The particular recipes for the photoresist compositions were identical to those provided in Table 6-A, supra. The photoresist compositions were deposited onto grained aluminum substrates at a coverage of about 100 to 110 mg/ft², spin-coated at 200 rpm, and dried. The plates were then overcoated with a 0.25 µm thick on-press removable protective overcoat, thus providing Example 19 plates (MG-7), Example 24 plates (MG-8), and Control-19 plates (No MG).

Example 20, 21, 22, 23, 25, 26, 27, and 28 plates were also prepared. Examples 20 to 23 were identical to Example 19, except MG-7 was complexed: with vinylsulfonic acid, sodium salt (VSA) (50 mol % of the cationic monomer) in Example 20; with 2-acrylamido-2-methyl-1-propanesulfonic acid, sodium salt (AMPSA-Na$^+$) (50 mol % of the cationic monomer) in Example 21; with AMPSA, ammonium salt (AMPSA-NH$_4^+$) (50 mol % of the cationic monomer) in Example 22; and with vinylphosphonic acid (VPA) in Example 23. Examples 25 and 28 were identical to Example 24, except MG-8 was complexed: with VSA in Example 25; with AMPSA-Na$^+$ in Example 26; with AMPSA-NH$_4^+$ in Example 27; and with VPA in Example 28.

The plates were halved, stored, and subsequently exposed in the manner set forth in Example 1. The plates were then mounted onto a printing press and run. Observations are provided in the following Table 19-C.

TABLE 19-B

Developability and Aging Performance of Cationic Microgel and Microgel Complexes

| Plate | Post-Exposure Treatment | Observations at Start of Run | Observations after 100 Images | Observations after 500 Images |
|---|---|---|---|---|
| Control 19 (No MG) | Room Temp. | Undeveloped | Not Clean | n/a |
| Control 19 (No MG) | 60° C./1 day | Undeveloped | Undeveloped | n/a |
| Example 19 | Room Temp. | Not Clean | Almost | n/a |

TABLE 19-B-continued

Developability and Aging Performance of Cationic Microgel and Microgel Complexes

| Plate | Post-Exposure Treatment | Observations at Start of Run | Observations after 100 Images | Observations after 500 Images |
|---|---|---|---|---|
| (MG-7) | | | Clean | |
| Example 19 (MG-7) | 60° C./1 day | Undeveloped | Undeveloped | n/a |
| Example 20 (MG-7/VSA) | Room Temp. | Not Clean | Almost Clean | n/a |
| Example 20 (MG-7/VSA) | 60° C./1 day | Undeveloped | Undeveloped | n/a |
| Ex. 21 (MG-7/AMPSA-Na$^+$) | Room Temp. | Clean | Clean | n/a |
| Ex. 21 (MG-7/AMPSA-NA$^+$) | 60° C./1 day | Undeveloped | Undeveloped | n/a |
| Ex. 22 (MG-7/AMPSA-Na$^+$) | Room Temp. | Clean | Clean | n/a |
| Ex. 22 (MG-7/AMPSA-NA$^+$) | 60° C./1 day | Undeveloped | Toning | n/a |
| Example 23 (MG-7/VPA) | Room Temp. | Almost Clean | Clean | n/a |
| Example 23 (MG-7/VPA) | 60° C./1 day | Reverse Image | Undeveloped | n/a |
| Example 24 (MG-8) | Room Temp. | Almost Clean | Clean | Clean |
| Example 24 (MG-8) | 60° C./1 day | Reverse Image | Not Clean | Not Clean |
| Example 25 (MG-8/VSA) | Room Temp. | Almost Clean | Clean | Clean |
| Example 25 (MG-8/VSA) | 60° C./1 day | Undeveloped | Undeveloped | Not Clean |
| Ex. 26 (MG-8/AMPSA-NA$^+$) | Room Temp. | Clean | Clean | Clean |
| Ex. 26 (MG-8/AMPSA-NA$^+$) | 60° C./1 day | Almost Clean | Toning | Toning |
| Ex. 27 (MG-8/(AMPSA-NH$_4^+$) | Room Temp. | Almost Clean | Clean | Clean |
| Ex. 27 (MG-8/(AMPSA-NH$_4^+$) | 60° C./1 day | Reverse Image | Undeveloped | Clean |
| Example 28 (MG-8/VPA) | Room Temp. | Clean | Clean | Clean |
| Example 28 (MG-8/VPA) | 60° C./1 day | Clean | Clean | Clean |

As apparent from Table 19-B, almost all microgel and microgel complex containing plates show better developability than the control at room temperature. Most also show modest improvements even after 60° C. aging.

Among this grouping of Examples, Example 28 (MG-8/VPA) provided the best developability and aging performance. The resolution provided by Example 28 is set forth in the following Tables 19-C-1 to 19-C-3.

TABLE 19-C-1

Resolution of Example 28 Plates (MG-8/VPA) at Start of Printing Run.

| Stored At Room Temperature | | | | | | | Stored 1 Day at 60° C. | | | | | | |
|---|---|---|---|---|---|---|---|---|---|---|---|---|---|
| LU | Gmax | Gmin | Hi | Sh | Hi$\mu$ | Sh$\mu$ | LU | Gmax | Gmin | Hi | Sh | Hi$\mu$ | Sh$\mu$ |
| 2 | 1 | 3 | 2 | 90 | 6 | 15 | 2 | 4 | 6 | 2 | 80 | 8 | 20 |
| 4 | 3 | 5 | 1 | 80 | 6 | 20 | 4 | 5 | 7 | 1 | 80 | 6 | 20 |
| 6 | 4 | 6 | 1 | 80 | 4 | 20 | 6 | 6 | 8 | 1 | 80 | 4 | 20 |
| 8 | 5 | 7 | 1 | 80 | 4 | 20 | 8 | 6 | 9 | 1 | 80 | 4 | 20 |
| 10 | 5 | 8 | 1 | 80 | 4 | 20 | 10 | 7 | 9 | 1 | 80 | 4 | 20 |

Notes:
LU: Exposure light unit; Gmax: Step number to reach maximum ink density; Hi: % Highlight dot; Sh: % Shadow dot; Hi$\mu$: Highlight microline; Sh$\mu$: Shadow microline.

TABLE 19-C-2

Resolution of Example 28 Plates (MG-8/VPA) after 100 Impressions.

| Stored At Room Temperature | | | | | | | Stored 1 Day at 60° C. | | | | | | |
|---|---|---|---|---|---|---|---|---|---|---|---|---|---|
| LU | Gmax | Gmin | Hi | Sh | Hi$\mu$ | Sh$\mu$ | LU | Gmax | Gmin | Hi | Sh | Hi$\mu$ | Sh$\mu$ |
| 2 | 1 | 3 | 2 | 90 | 6 | 15 | 2 | 3 | 5 | 2 | 80 | 8 | 20 |
| 4 | 3 | 5 | 1 | 80 | 6 | 20 | 4 | 5 | 6 | 1 | 80 | 6 | 20 |
| 6 | 4 | 6 | 1 | 80 | 4 | 20 | 6 | 5 | 7 | 1 | 80 | 4 | 20 |
| 8 | 5 | 7 | 1 | 80 | 4 | 20 | 8 | 5 | 8 | 1 | 80 | 4 | 20 |
| 10 | 5 | 8 | 1 | 80 | 4 | 20 | 10 | 6 | 9 | 1 | 80 | 4 | 20 |

Notes:
LU: Exposure light unit; Gmax: Step number to reach maximum ink density; Hi: % Highlight dot; Sh: % Shadow dot; Hi$\mu$: Highlight microline; Sh$\mu$: Shadow microline.

TABLE 19-C-3

Resolution of Example 28
Plates (MG-8/VPA) after 300 Impressions.

| Stored At Room Temperature | | | | | | | Stored 1 Day at 60° C. | | | | | | |
|---|---|---|---|---|---|---|---|---|---|---|---|---|---|
| LU | Gmax | Gmin | Hi | Sh | Hi$\mu$ | Sh$\mu$ | LU | Gmax | Gmin | Hi | Sh | Hi$\mu$ | Sh$\mu$ |
| 2 | 1 | 3 | 2 | 90 | 6 | 15 | 2 | 3 | 5 | 2 | 80 | 8 | 20 |
| 4 | 3 | 5 | 1 | 80 | 6 | 20 | 4 | 5 | 6 | 1 | 80 | 6 | 20 |
| 6 | 4 | 6 | 1 | 80 | 4 | 20 | 6 | 5 | 7 | 1 | 80 | 4 | 20 |
| 8 | 5 | 7 | 1 | 80 | 4 | 20 | 8 | 5 | 8 | 1 | 80 | 4 | 20 |
| 10 | 5 | 8 | 1 | 80 | 4 | 20 | 10 | 6 | 9 | 1 | 80 | 4 | 20 |

Notes:
LU: Exposure light unit; Gmax: Step number to reach maximum ink density; Hi: % Highlight dot; Sh; % Shadow dot; Hi$\mu$: Highlight microline; Sh$\mu$: Shadow microline.

As shown, the resolution and $G_{max}$ of the room-temperature stored Example 28 plate remains the same from start to 300 impressions. The resolution of the 60° C. also remains the same while Gmax drops a step from start to 100 impressions. The microgel component of Example 28 was tested with different resist recipes in alternative plate configuration. The results were analogous.

Examples 29 to 30

(Covalently Bonded Microgel Complex)

Microgel compositions were prepared using a standard inverse emulsion polymerization protocol and the recipes set forth in the following Table 29-A:

TABLE 29-A

Preparation of Covalently-Bonded Microgel Complexes

| Component | MG-9 wt(g) | MG-8 wt(g) |
|---|---|---|
| Disperse Aqueous Phase: | | |
| H$_2$O | 38.0 | 38.0 |
| Acrylamide | 31.05 | 31.05 |
| Acrylic Acid | 3.45 | 3.45 |
| N,N-methylene bisacrylamide | 2.0 | 2.0 |
| Glycidyl methacrylate (2-hydroxyethyl methacrylate) | 2.0 | 2.0 |
| Continuous Organic Phase: | | |
| Xylene | 100 | 100 |
| Acrylamide | 0.3 | 0.3 |
| Hypermer B246, a triblock polymeric surfactant from ICI | 5.0 | 5.0 |
| Initiator Solution: | | |
| Xylene | 10.0 | 10.0 |
| Azobisisobutyronitrile, AIBN | 0.022 | 0.022 |
| Batch Size | 189.32 | 189.32 |

2-hydroxyethyl methacrylate (2-HEMA) and glycidyl methacrylate (GMA) were used to form the covalent bonding complex with the above microgel-containing acrylic acid. During synthesis, the pH of the aqueous phase is adjusted to 6.68 prior to the preparation of microgels by adding 19.15 g NaOH (10%) solution, thus neutralizing the acid. After the microgel is made, 2 g of 2-HEMA or GMA and 20 g of HCl (10%) solution are added into the solution to reduce the pH and thus facilitate condensation polymerization. Solutions were stirred overnight.

The microgel compositions MG-9 to MG-10 were subsequently incorporated into a photoresist composition. For comparison, a photoresist composition identical to the microgel-containing resists, except for the absence of microgel, was also prepared. The particular recipes for the photoresist compositions were identical to those provided in Table 6-A, supra. The photoresist compositions were then deposited onto grained aluminum substrates at a coverage of about 100 to 110 mg/ft$^2$, spin-coated at 200 rpm, and dried. The plates were then overcoated with a 0.25 $\mu$m thick on-press removable protective overcoat, thus providing Example 29 plates (MG-9), Example 30 plates (MG-10), and Control-29 plates (No MG). The plates were halved, stored, and subsequently exposed in the manner set forth in Example 1. The plates were mounted onto a printing press and run. Observations are provided in the following Table 29-B.

TABLE 29-B

Developability and Aging Performance
of Covalently Bonded Microgel Complexes

| Plate | Post-Exposure Treatment | Observations at Start of Run | Observations after 100 Images |
|---|---|---|---|
| Control 29 (No MG) | Room Temp. | Undeveloped | Not Clean |
| " | 60° C./1 day | Undeveloped | Undeveloped |
| Example 29 (MG-9) | Room Temp. | Not Clean | Clean |
| " | 60° C./1 day | Reverse Image | Undeveloped |
| Example 30 (MG-10) | Room Temp. | Not Clean | Clean |
| Example 30 (MG-10) | 60° C./1 day | Reverse Image | Undeveloped |

As apparent from Table 29-B, plates utilizing covalently bonded microgel complexes and stored at room temperature, result in modestly better developability as compared to the Control. Aging performance appears unaffected.

We claim:

1. A method for printing images on a receiving medium, the method utilizing a printing press, the printing press provided with fountain and ink solutions, the method comprising the steps of:

providing a photosensitive composition comprising at least a photopolymerizable, photocrosslinkable, or photorearrangeable compound and a hygroscopic microgel, the microgel having a dry glass transition temperature (dry T$_g$) greater than room temperature and comprising crosslinked polymeric particulate beads, the size of said beads ranging from about 0.01 $\mu$m to about 5 $\mu$m, the outer surfaces of said beads being hydrophilic, said beads being sufficiently crosslinked and sufficiently incompatible with said photopolymerizable, photocrosslinkable, or photorearrangeable compound to prevent substantial swelling of said beads in said fountain solution and in said photopolymerizable, photocrosslinkable, or photorearrangeable compound;

depositing said photosensitive composition onto a substrate to provide a photosensitive layer thereon, the photosensitive layer capable of being imagewise photohardened, photosolubilized, or photodifferentiated upon imagewise exposure to actinic radiation;

imagewise exposing the photosensitive layer to actinic radiation to effect imagewise photohardening, photosolubilization, or photodifferentiation in exposed areas, thereby producing an imagewise exposed article; and treating the imagewise exposed article with fountain and ink solutions in a printing press, whereby ink becomes imagewise localized in either exposed or unexposed areas of said article to form an imagewise distribution of ink transferable to a receiving medium.

2. The method of claim 1, wherein said photopolymerizable, photocrosslinkable, or photorearrangeable compound is an ethylenically unsaturated monomer, and whereby said photosensitive layer photohardens upon imagewise exposure to actinic radiation.

3. The method of claim 2, wherein said photosensitive composition further comprises a free radical generating photopolymerization initiating system.

4. The method of claim 1, further comprising the step of:

depositing a polymeric overcoat over said photosensitive layer prior to said imagewise exposure, said imagewise exposure being conducted through said polymeric overcoat, said polymeric overcoat being soluble or dispersible in said fountain and ink solutions such that said polymeric overcoat is removed with said fountain and ink solutions.

5. The method of claim 1, wherein said substrate is a hydrophilic, fountain solution receptive substrate.

6. The method of claim 5, wherein said hydrophilic, fountain solution receptive substrate is a grained aluminum substrate.

7. The method of claim 1, wherein said photosensitive layer has a concentration of microgel not greater than about 30% dry weight of said photosensitive layer.

8. The method of claim 1, wherein said hygroscopic microgel is a nonionic microgel.

9. The method of claim 8, wherein said nonionic microgel is a nonionic microgel complex comprising vinylphosphonic acid.

10. The method of claim 1, wherein the crosslinked polymeric particulate bead of said hygroscopic microgel is resultant of crosslinking employing a monomer having more than one photopolymerizable ethylenically unsaturated bond.

11. The method of claim 10, wherein said monomer is N,N'-alkylenebisacrylamide.

* * * * *